United States Patent
Zhang et al.

(10) Patent No.: US 11,531,068 B2
(45) Date of Patent: Dec. 20, 2022

(54) APPARATUS AND METHOD FOR TRACKING ELECTRODE CAPACITY

(71) Applicant: GM GLOBAL TECHNOLOGY OPERATIONS LLC, Detroit, MI (US)

(72) Inventors: Alfred Zhang, Troy, MI (US); Charles W. Wampler, Birmingham, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 392 days.

(21) Appl. No.: 16/782,677

(22) Filed: Feb. 5, 2020

(65) Prior Publication Data

US 2021/0239762 A1 Aug. 5, 2021

(51) Int. Cl.
*G01R 31/367* (2019.01)
*G01R 31/396* (2019.01)
*G01R 31/3835* (2019.01)
*H01M 10/44* (2006.01)
*H01M 10/48* (2006.01)

(52) U.S. Cl.
CPC ....... *G01R 31/367* (2019.01); *G01R 31/3835* (2019.01); *G01R 31/396* (2019.01); *H01M 10/44* (2013.01); *H01M 10/486* (2013.01)

(58) Field of Classification Search
None
See application file for complete search history.

(56) References Cited

U.S. PATENT DOCUMENTS

| | | | | |
|---|---|---|---|---|
| 5,730,243 | A * | 3/1998 | Koike | G01R 31/3648 180/170 |
| 7,315,789 | B2 * | 1/2008 | Plett | G01R 31/3842 702/65 |
| 9,766,297 | B2 | 9/2017 | Frost et al. | |
| 10,288,692 | B2 | 5/2019 | Laskowsky et al. | |
| 2012/0251860 | A1 * | 10/2012 | Marple | H01M 6/02 29/623.5 |
| 2012/0316814 | A1 * | 12/2012 | Rahaman | G01R 31/392 702/63 |
| 2016/0327613 | A1 * | 11/2016 | Tenmyo | H02J 7/008 |
| 2018/0120361 | A1 * | 5/2018 | Choi | H02J 7/0047 |
| 2019/0308630 | A1 | 10/2019 | Raghunathan et al. | |
| 2020/0217901 | A1 * | 7/2020 | Sugiyama | H02J 7/00036 |

* cited by examiner

*Primary Examiner* — Jas A Sanghera
(74) *Attorney, Agent, or Firm* — Quinn IP Law

(57) ABSTRACT

An apparatus and method for tracking a battery cell is disclosed, for a device having one or more sensors and a controller with a processor and tangible, non-transitory memory. The method includes obtaining respective sensor data relative to an anode and a cathode. A predicted anode capacity and predicted cathode capacity are determined based on the respective sensor data. The predicted anode capacity and predicted cathode capacity each have a respective variance value. An updated set of variables and updated respective variance values are generated based in part on the predicted anode capacity, the predicted cathode capacity and a measured equilibrium voltage, via a Kalman filter module executed by the controller. The updated set of variables include an updated anode capacity and an updated cathode capacity. Operation of the device is controlled based in part on the updated set of variables and updated respective variance values.

20 Claims, 2 Drawing Sheets

APPARATUS AND METHOD FOR TRACKING ELECTRODE CAPACITY

INTRODUCTION

The present disclosure relates generally to an apparatus and a method for tracking a battery cell, and more specifically, to tracking individual electrode capacities in the battery cell. The use of mobile platforms employing a rechargeable energy source, both as an exclusive source of energy and a non-exclusive source of energy, has greatly increased over the last few years. A battery pack may store and release electrochemical energy as needed during a given operating mode. The electrochemical energy may be employed for propulsion, heating or cooling a cabin compartment, powering vehicle accessories and other uses. The various cells in the battery packs may be characterized by different power, state of charge and capacity rates, which may degrade with time and usage.

SUMMARY

Disclosed herein is an apparatus and a method for tracking a battery cell in a device having one or more sensors and a controller with a processor and tangible, non-transitory memory. The battery cell has an anode and a cathode. The method includes obtaining respective sensor data relative to the anode and the cathode, via the one or more sensors, and determining a predicted anode capacity and a predicted cathode capacity based on the respective sensor data. The predicted anode capacity and the predicted cathode capacity each have a respective variance value.

The controller is configured to selectively execute a Kalman filter module and generate an updated set of variables and updated respective variance values based in part on the predicted anode capacity, the predicted cathode capacity and a measured equilibrium voltage, via the Kalman filter module. The updated set of variables include an updated anode capacity and an updated cathode capacity. Operation of the device is controlled based in part on the updated set of variables and the updated respective variance values. The method tracks individual electrode capacities as the battery degrades with time and usage, for applications including but not limited to, electric and hybrid-electric vehicles.

The method includes obtaining the measured equilibrium voltage based on the respective sensor data or a battery state estimator module accessible to the controller. Controlling operation of the battery cell may include transmitting a message when at least one of the updated set of variables is outside a predefined range. Controlling operation of the battery cell may include resting the battery cell for a predefined time when at least one of the updated set of variables is outside the predefined range. Controlling operation of the battery cell may include charging or discharging the battery cell when at least one of the updated set of variables is outside the predefined range and determining an updated charge capacity. Where the battery cell is part of a battery pack, controlling operation of the battery cell may include derating a power rating of the battery pack.

The method may further include determining an integrated current value based on Coulomb counting and the respective sensor data, via the controller. A predicted anode state of charge and a predicted cathode state of charge is determined based at least partially on the predicted anode capacity, the predicted cathode capacity and the integrated current value, via the controller. The updated set of variables may include an updated anode state of charge and an updated cathode state of charge.

The controller may be configured to determine updated values of multiple parameters of interest and respective associated uncertainties based on the updated set of variables and the updated respective variance values. For example, the controller may be configured to determine an updated full cell capacity, an updated open circuit voltage, an updated anode capacity degradation rate, an updated cathode capacity degradation rate, an updated negative to positive ratio of electrochemical capacity and an updated remaining active lithium factor, and their respective associated uncertainties.

The method allows for energy optimization and long-term component health in real-time, taking into account the loss of lithium and the different aging rates of the cathode and anode. By accounting for sensitivity to noise factors and correlations thereof, the method may be employed to determine other values of parameters of interest with reduced variation. Moreover, the method estimates its own accuracy, which allows other modules or programs that consume the updated set of variables to make better estimates and decisions.

The above features and advantages and other features and advantages of the present disclosure are readily apparent from the following detailed description of the best modes for carrying out the disclosure when taken in connection with the accompanying drawings.

DETAILED DESCRIPTION

Figure 1:
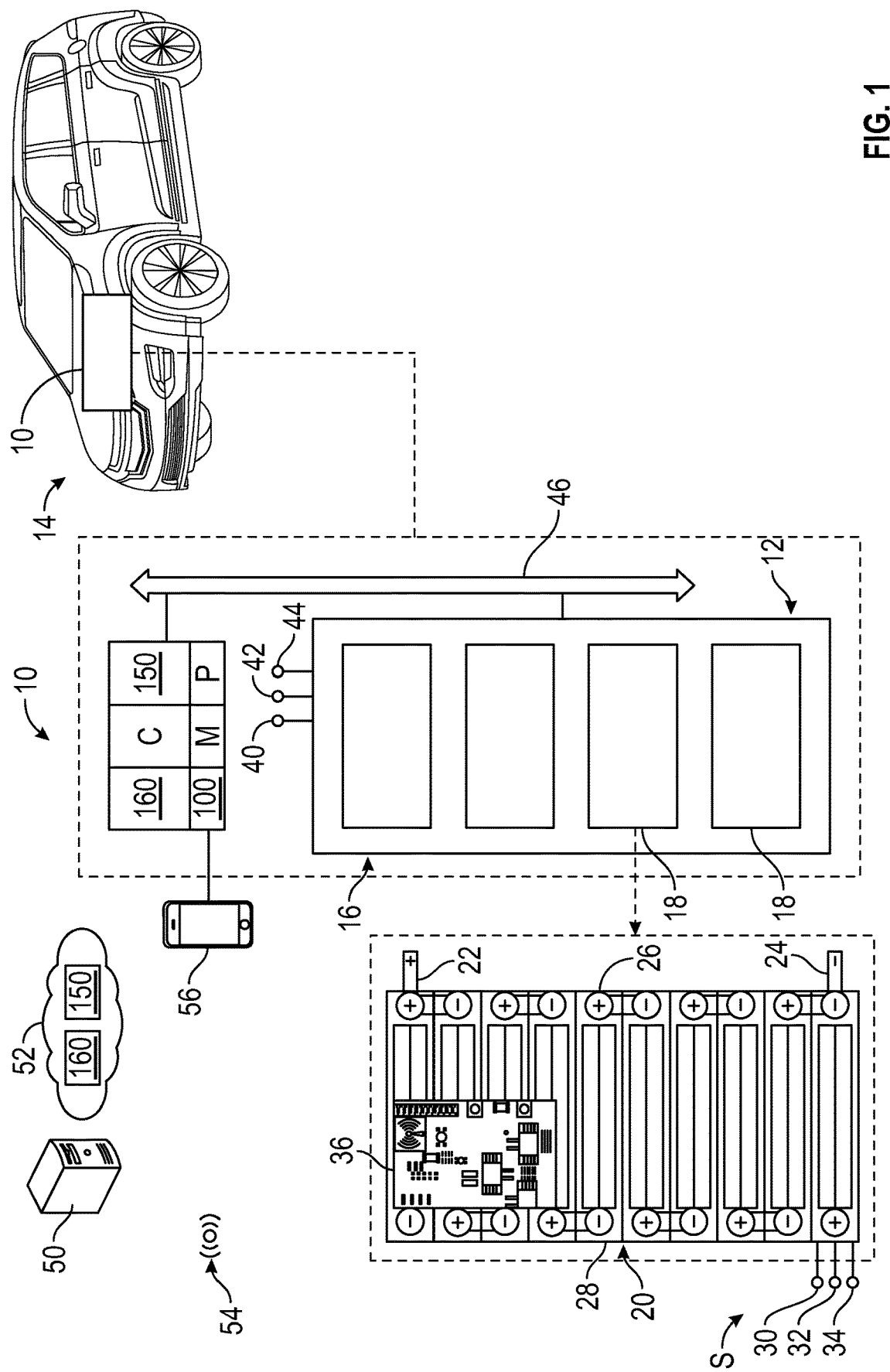
FIG. 1 is a schematic illustration of a device having a rechargeable energy storage unit, a controller and/or a mobile application.

Referring to the drawings, wherein like reference numbers refer to like components, FIG. 1 schematically illustrates a system 10 for tracking or monitoring one or more components of a rechargeable energy storage unit 12, which may be part of a device 14. The device 14 may be a mobile platform, such as, but not limited to, a passenger vehicle, sport utility vehicle, light truck, heavy duty vehicle, ATV, minivan, bus, transit vehicle, bicycle, moving robot, farm implement (e.g. tractor), sports-related equipment (e.g. golf cart), boat, plane and train. The device 14 may be a non-mobile platform, such as a desktop computer. It is to be understood that the device 14 may take many different forms and have additional components.

Referring to FIG. 1, the rechargeable energy storage unit 12 includes at least one battery pack, such as battery pack 16, having a plurality of modules 18. Referring to FIG. 1, the plurality of modules 18 includes at least one battery cell 20 ("at least one" omitted henceforth) connected for current flow between a first terminal 22 and a second terminal 24. Each battery cell 20 respectively includes an anode 26 and a cathode 28. The battery cell 20 may include cells having different chemistries, including but not limited to, lithium-ion, lithium-iron, nickel metal hydride and lead acid batteries. The number of cells per module and the number of modules per battery pack may be selected based on the application at hand.

Referring to FIG. 1, the system 10 includes a controller C having at least one processor P and at least one memory M (or non-transitory, tangible computer readable storage medium) on which instructions are recorded for executing a method 100, described below with respect to FIG. 2. The memory M may store executable instruction sets, and the processor P may execute the instruction sets stored in the memory M. The controller C may be an integral portion of, or a separate module operatively connected to, other controllers of the device 14.

As described below, the method 100 employs time-based measurements of the battery cell 20 (e.g. voltage, current, and temperature) with associated uncertainty quantification, and predicts changes in individual electrode capacity, as well as anode state of charge and cathode state of charge based on an integrated current value. The system 10 is configured to compute an equilibrium voltage, based on the anode state of charge and the cathode state of charge, and compare the computed and measured equilibrium voltages.

The method 100 may employ a Kalman filter module 150 (see FIG. 1) available to those skilled in the art, and selectively executable by the controller C, to track the respective capacity and respective state of charge (SOC) of each electrode, i.e., anode 26 and cathode 28. Over the life of the battery cell 20, the respective cathode and anode capacities may degrade at different rates, reshaping an open-circuit voltage (OCV) curve of the battery cell 20. By tracking the individual electrode capacities, the system 10 provides a more detailed view of the state of health of the battery cell 20. Once the individual electrode capacities and individual electrode state of charge have been determined, other parameters of interest may be calculated. Referring to FIG. 1, the controller C may be configured to access and/or execute a battery state estimator module 160 available to those skilled in the art. The Kalman filter module 150 and battery state estimator module 160 may be embedded in the controller C or remotely located (e.g. in cloud 52) and otherwise accessible to the controller C.

The controller C is specifically configured to execute the blocks of method 100 and may receive input from one or more sensors S, such as first sensor 30, second sensor 32 and third sensor 34, configured to obtain respective sensor data relative to the battery cell 20. The first sensor 30 may be a voltage sensor configured to generate a voltage signal representative of a voltage between the anode 26 and the cathode 28 during an equilibrium condition. The second sensor 32 may be a current sensor configured to generate a current signal representative of a current associated with the battery cell 20. The third sensor 34 may be a temperature sensor configured to generate respective temperature signals associated with the anode 26 and the cathode 28.

Referring to FIG. 1, a module management unit 36 may be embedded in each of the plurality of modules 18 and configured to collect and/or measure parameters such as cell voltage, current and temperature. The sensors S may further include pack sensors 40, 42, 44 configured to measure parameters pertaining to the battery pack 16. The sensors S and module management unit 36 may be in communication with the controller C via a communication BUS 46, which may be in the form of a serial Controller Area Network (CAN-BUS).

Referring to FIG. 1, the controller C may be configured to communicate with a remote server 50 and/or a cloud unit 52, via a wireless network 54, which may be a short-range network or a long-range network. The remote server 50 may be a private or public source of information maintained by an organization, such as for example, a research institute or a company. The cloud unit 52 may include one or more servers hosted on the Internet to store, manage, and process data.

The controller C may be configured to receive and transmit wireless communication to the remote server 50 through a mobile application 56, shown in FIG. 1. Referring to FIG. 1, the mobile application 56 may include a communications interface enabling vehicle-to-vehicle (V2V), vehicle-to-everything (V2X) and other types of communication, such as V2I, V2N, V2V, V2P, V2D and V2G. The mobile application 56 may be in communication with the controller C such that it has access to the data in the controller C. For example, the mobile application 56 may be embedded in a smart phone belonging to a user of the device 14 and plugged or otherwise linked to the device 14. The mobile application 56 may be physically connected (e.g. wired) to the controller C. Alternatively, the mobile application 56 may be embedded in the controller C. The circuitry and components of a mobile application 56 ("apps") available to those skilled in the art may be employed.

The wireless network 54 may be a Wireless Local Area Network (LAN) which links multiple devices using a wireless distribution method, a Wireless Metropolitan Area Networks (MAN) which connects several wireless LANs or a Wireless Wide Area Network (WAN) which covers large areas such as neighboring towns and cities. The wireless network 54 may be WIFI or a Bluetooth™ connection, defined as being a short-range radio technology (or wireless technology) aimed at simplifying communications among Internet devices and between devices and the Internet. Bluetooth™ is an open wireless technology standard for transmitting fixed and mobile electronic device data over short distances and creates personal networks, operating within the 2.4 GHz band. Other types of connections may be employed.

Figure 2:
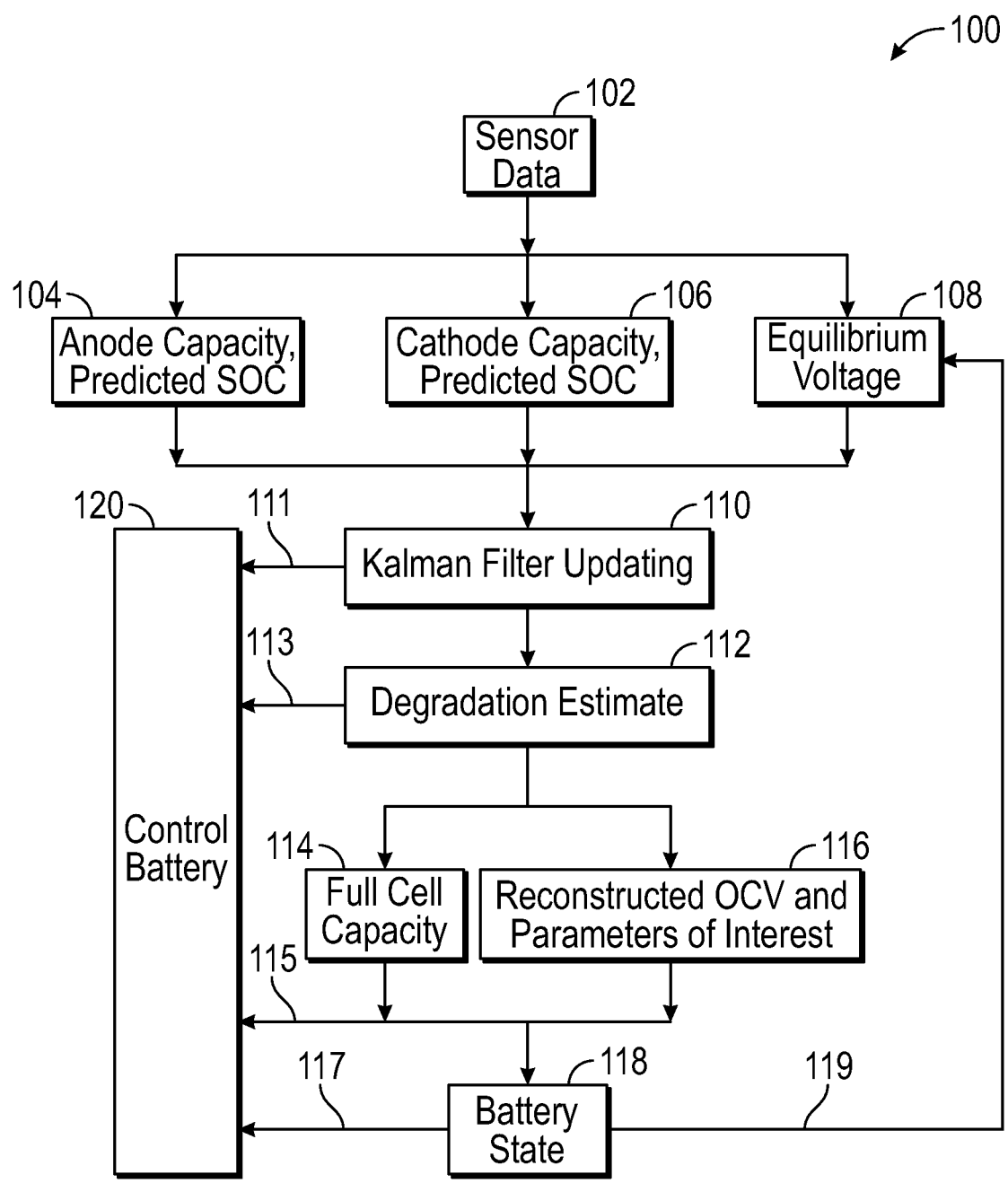
FIG. 2 is a schematic flow diagram of a method executable by the controller and/or mobile application of FIG. 1, for tracking one or more components of the rechargeable energy storage unit.

Referring now to FIG. 2, a flowchart of the method 100 is shown. Method 100 may be stored on and executable by at least one of the controller C and the mobile application 56 of FIG. 1. The method 100 need not be applied in the specific order recited herein and may be dynamically executed. Furthermore, it is to be understood that some steps may be eliminated. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine. While the method 100 is described below with respect to the controller C, it is understood that the method 100 may be executed by the mobile application 56.

Per block 102 of FIG. 2, the controller C is configured to obtain respective sensor data relative to the anode 26 and the cathode 28, via the one or more sensors S. While the method 100 is described herein with respect to one battery cell 20, it is understood that the method 100 may be executed with respect to each of the battery cells in the battery pack 16.

Per block 104 of FIG. 2, the controller C is configured to determine a predicted anode capacity at time n−1 (or update sequence n−1). Per block 106 of FIG. 2, the controller C is configured to determine a predicted cathode capacity. The electrode capacities may be defined as:

$q_{pos,n-1}:=Cap_{ref}/Cap_{pos}$ (scaled) reciprocal of predicted cathode capacity at time n.

$q_{neg,n-1}:=Cap_{ref}/Cap_{neg}$ (scaled) reciprocal of predicted anode capacity at time n.

In one example, the value of $Cap_{ref}$ is set to 1.

Per block 108, the controller C is configured to obtain a measured equilibrium voltage, which may be obtained from the sensors S or the battery state estimator module 160 of FIG. 1 (as indicated by line 119 of FIG. 2). The measured equilibrium voltage signal may either come directly from the respective sensor data (via a voltage sensor) when the battery cell 20 has been at rest long enough (that condition being enforced by some controller logic) or it may come continuously from the battery state estimator module 160. The battery state estimator module 160 may employ its own Kalman filtering process to estimate what the equilibrium voltage would be even while the battery cell 20 is in use.

Also, per blocks 104 and 106, the method 100 may include determining a predicted anode state of charge ($s_{pos,n-1}$) and a predicted cathode state of charge ($s_{neg,n-1}$), based at least partially on the predicted anode capacity, the predicted cathode capacity factor and an integrated current value. The integrated current value or (scaled) Coulomb count may be represented as $a_n := (\int_{t_{n-1}}^{t_n} I\, dt)/Cap_{ref}$. The amp-hour integration between rested voltages a, amp-hour throughput integration $a_t$, and integration of squared current $a_{2t}$, may be described as follows: $a = \Delta Ah = \Sigma I \Delta t$, $a_t = \Delta |Ah| = \Sigma |I \Delta t|$ and $a_{2t} = \Sigma (I \Delta t)^2$, where I is the measured current, and $\Sigma$ means a sum over all the time steps $\Delta t$ going from time $t_{n-1}$ to time $t_n$. The sign convention used here is that charge current is positive and discharge current is negative. Thus, if there is charging, then a>0 and if we are discharging then a<0. It is understood that alternative approaches may be employed.

Per block 110 of FIG. 2, the controller C is configured to employ the Kalman filter module 150 of FIG. 1 to process the data from block 104, block 106 and block 108, and generate an updated set of variables and updated respective variance values. The Kalman filter module 150 works in a recursive fashion and runs in real time using the current state, the previously calculated state and its uncertainty matrix. The Kalman filter module may work in a two-step process. For example, in a first step, the Kalman filter module 150 produces estimates of the current state variables, along with their uncertainties. Once the outcome of the next measurement (having a discrete amount of error such as random noise) is observed, these estimates are updated using a weighted average, with more weight being given to estimates with higher certainty. The Kalman filter module 150 may incorporate various types of Kalman filtering, such as but not limited to, Extended Kalman Filter, Sigma-Point Kalman Filter, Square-Root Kalman Filter and other variants.

Per block 120 of FIG. 2, the method 100 includes controlling operation of the battery cell 20 based in part on the updated set of variables and the updated respective variance values outputted from block 110. For example, the controller C may be configured to transmit a message or alert when at least one of the updated set of variables is outside a first predefined range. The message may be sent to a user, owner or fleet manager of the device 14 via the mobile application 56, to schedule a maintenance check or follow up. The alert may be sent to the remote server 50 via the wireless network 54 and/or the mobile application 56.

The controller C may be configured to manage charging and discharging cycles of the battery pack 16 with increased efficiency based on the updated set of variables. Controlling operation of the battery cell 20 may include resting the battery cell 20 for a predefined time when at least one of the updated set of variables is outside a second predefined range. The term "rest" includes a stasis condition in which the battery cell 20 is neither charging nor discharging. Controlling operation of the battery cell 20 may include charging or discharging the battery cell 20 when at least one of the updated set of variables is outside a third predefined range and determining an updated charge capacity.

The controller C may be configured to derate or reduce a power rating of the battery pack 16 when at least one of the updated set of variables is outside a fourth predefined range. The first, second, third and fourth predefined ranges may be different or may overlap. If the total power rating of the rechargeable energy storage unit 12 is sufficiently reduced (i.e. reaches a predefined minimum), the controller C may be configured to switch to an alternative mode of operation, which may be a limp-home mode or other mode restricting energy consumption and/or speed of the device 14.

Operation of the battery cell 20 may also be controlled based on the results obtained from blocks 112, 114, 116 and 118, as indicated respectively by lines 111, 113, 115 and 117. Per block 112, the method 100 may include determining an updated anode capacity degradation rate and an updated cathode capacity degradation rate. Per block 114, the method 100 may include determining an updated full cell capacity. Per block 116, the method 100 may include determining updated values of other parameters of interest based on the updated set of variables and the updated respective variance values.

For example, as described below, the controller C may be configured to determine an updated open circuit voltage, an updated negative to positive ratio of electrochemical capacity (N to P ratio) and an updated remaining active lithium factor. Additionally, the method 100 may include determining respective uncertainty values associated with these parameters. The respective associated uncertainty values for the parameters of interest may be calculated using a linear approximation, with the Kalman filter module 150. Per block 118 of FIG. 2, the output of blocks 114 and 116 may be fed into a battery state estimator module 160 accessible to the controller C.

Kalman Filter Updating

The Kalman filter module 150 is executed to update a state vector $x_{n-1}$ to obtain an updated state vector $x_n$. The state transition equations may be represented as follows:

$$q_{pos,n} = q_{pos,n-1} + \xi_{1,n}$$

$$q_{neg,n} = q_{neg,n-1} + \xi_{2,n}$$

$$s_{pos,n} = s_{pos,n-1} - a_n q_{pos,n-1} - q_{pos,n-1}\xi_{3,n}$$

$$s_{neg,n} = s_{neg,n-1} + a_n q_{neg,n-1} + q_{neg,n-1}\xi_{4,n}$$

The updated state vector may be represented as follows:

$$x_n = \begin{bmatrix} q_{pos} \\ q_{neg} \\ s_{pos} \\ s_{neg} \end{bmatrix}_n$$

The noise vector $\xi$ may be defined as:

$$\xi = \begin{bmatrix} \xi_1 \\ \xi_2 \\ \xi_3 \\ \xi_4 \end{bmatrix},$$

modelled as a zero mean random distribution with covariance given as a square matrix $\Xi$. The noise vector serves to accommodate various unknowns in the process, such as sensor error in measuring current, timing errors, and electrochemical degradation processes. These unknowns either alter one or both electrode capacities and/or cause errors to accumulate in the Coulomb count of how much lithium has moved from one electrode to the other.

Although the exact values of the noise inputs at a time step are unknown, it is assumed that they have an available covariance. As understood by those skilled in the art, a covariance matrix is a square matrix whose diagonal entries are the variances of the individual entries in a given random vector and whose off-diagonal entries are the covariances between pairs of elements of that vector. As an example, the covariance matrix $\Xi$ may be taken to be block diagonal and may be expressed in terms of five calibration parameters: $\sigma_{w,pos}^2$, $\sigma_{w,neg}^2$, $\sigma_I^2$, $r_q$, $r_I$, as follows.

$$\Xi = \begin{bmatrix} \sigma_{w,pos}^2 a_{t,n} & r_q \sigma_{w,neg} \sigma_{w,pos} a_{t,n} & 0 & 0 \\ r_q \sigma_{w,neg} \sigma_{w,pos} a_{t,n} & \sigma_{w,neg}^2 a_{t,n} & 0 & 0 \\ 0 & 0 & \sigma_I^2 a_{2t,n} & r_I \sigma_I^2 a_{2t,n} \\ 0 & 0 & r_I \sigma_I^2 a_{2t,n} & \sigma_I^2 a_{2t,n} \end{bmatrix}$$

Other formulations for the covariance matrix $\Xi$ may be employed. The respective variance values for $[\xi_{1,n}, \xi_{2,n}, \xi_{3,n}, \xi_{4,n}]$ may be characterized as $[\sigma_{w,pos}^2 a_{t,n}, \sigma_{w,neg}^2 a_{t,n}, \sigma_I^2 a_{2t,n}, \sigma_I^2 a_{2t,n}]$.

The anode degradation and cathode degradation may be correlated, and the random walk tracks the degradation. If calibration parameter $r_q=1$, then the two degradations are perfectly correlated, meaning that the two electrode capacities march in lock step (though active lithium can still be lost), whereas for $r_q<1$, they may degrade to some extent independently. If calibration parameter $r_I=1$, then the errors in the updates in the two states of charge are perfectly correlated, as would be the case if the error was due to Coulomb counting alone. In contrast, a value $r_I<1$ indicates that some uncorrelated behavior may happen, such as a loss of active lithium, so that the amount of lithium de-intercalating from one electrode is not exactly equal to the amount intercalating into the other electrode. The negative sign in the matrix G represents the fact that when one electrode gains lithium, the other loses lithium.

The state transition equations may be represented in matrix form, as shown below: $x_n = Fx_{n-1} + G\xi_n$, where:

$$F_n = \begin{bmatrix} 1 & 0 & 0 & 0 \\ 0 & 1 & 0 & 0 \\ -a_n & 0 & 1 & 0 \\ 0 & a_n & 0 & 1 \end{bmatrix}, \text{ and}$$

$$G_n = \begin{bmatrix} 1 & 0 & 0 & 0 \\ 0 & 1 & 0 & 0 \\ 0 & 0 & -q_{pos,n-1} & 0 \\ 0 & 0 & 0 & q_{neg,n-1} \end{bmatrix}.$$

The measured equilibrium voltage (EV) or rested voltage is based at least partially on the predicted state of charge ($s_{pos,n}$), the predicted cathode state of charge ($s_{neg,n}$) and a measurement noise variable ($\zeta$) which may be represented as a Gaussian distribution:

$$EV_n = h(x_n) = [U_{pos}(s_{pos,n}) - U_{neg}(s_{neg,n}) + \zeta_n]$$

Here, $\zeta_n \sim N(0, \sigma_{v,n}^2)$ is a zero-mean random variable with the respective variance value $\sigma_{v,n}^2$. Here the measured voltage is not directly transformed to the state of charge (SOC). The open circuit voltage curve relates the state of charge of the battery cell 20 to the open circuit voltage, such that: Open Circuit Voltage=U(SOC). If the measured equilibrium voltage (EV) is coming from the battery state estimator module 160 of FIG. 1, the battery state estimator module 160 can also provide $\sigma_{v,n}^2$. If EV is coming from the sensors S after the device 14 has rested, $\sigma_{v,n}^2$ may be adjusted according to how long the device 14 has been at rest or how much the voltage has changed in a prior time duration (e.g., the last 10 minutes). Since it may take some time for the battery cell 20 to come to full equilibrium, a reading taken where the battery cell 20 has rested for a shorter time duration (e.g. 20 or 30 minutes) is still informative but there is less certainty about where the measured equilibrium voltage will finally settle. In other words, the value of $\sigma_{v,n}^2$ may vary and may be specified to the controller C in a meaningful way depending on the operating conditions.

The covariance of the measurement noise variable $\zeta$ is a scalar. The respective variance values represent sensor error as well as errors from hysteresis, diffusion, and other sources. From a first order approximation, the measurement matrix H is:

$$H_n = \begin{bmatrix} \frac{\partial h}{\partial q_{pos,n}} & \frac{\partial h}{\partial q_{neg,n}} & \frac{\partial h}{\partial s_{pos,n}} & \frac{\partial h}{\partial s_{neg,n}} \end{bmatrix}$$
$$= \begin{bmatrix} 0 & 0 & \frac{\partial U_{pos}}{\partial s_{pos}}\bigg|_{s_{pos}=s_{pos,n}} & -\frac{\partial U_{neg}}{\partial s_{neg}}\bigg|_{s_{neg}=s_{neg,n}} \end{bmatrix}$$

The Kalman filter module 150 may be configured to incorporate the following equations:

$$\hat{x}_{n|n-1} = F_n \hat{x}_{n-1}$$

$$P_{n|n-1} = F_n P_{n-1|n-1} F_n^T + G_n \Xi_n G_n^T$$

$$\tilde{z}_n = z_n - h(\hat{x}_{n|n-1})$$

$$M_n = \sigma_{v,n}^2 + H_n P_{n|n-1} H_n^T$$

$$K_n = P_{n|n-1} H_n^T M_n^{-1}$$

$$\hat{x}_{n|n} = \hat{x}_{n|n-1} + K_n \tilde{z}_n$$

$$P_{n|n} = (I - K_n H_n) P_{n|n-1} = (I - K_n H_n) P_{n|n-1} (I - K_n H_n)^T + K_n Z_n K_n$$

At the $n^{th}$ update, the state variables are:

$$\hat{x}_{n|n} = \begin{bmatrix} q_{pos,n} \\ q_{neg,n} \\ s_{pos,n} \\ s_{neg,n} \end{bmatrix}$$

The covariance matrix at the $n^{th}$ update is $P_{n|n}$.
Updated Anode and Cathode Capacity Degradation Rate In another variation, the Kalman filter module 150 may be configured to determine respective rate of degradation terms for the anode 26 and the cathode 28, as shown below: $q_n = q_{n-1} + p_{n-1}\Delta Ah_{thru,n-1}^{\gamma} + noise_q$, where $\Delta Ah_{thru} = \int_{t_{n-1}}^{t_{kn+1}} |I| dt > 0$ is amp-hour throughput, and $\gamma$ is an empirically determined exponent. The degradation rate coefficient, p, may be assumed to follow a random walk such that: $p_{n-1} = p_n + noise_p$, where $noise_p$ is a zero-mean random variable with variance $\sigma_p^2$. Other degradation estimates may be employed. The state vector may be modified to be:

$$x_n = \begin{bmatrix} p_{pos} \\ q_{pos} \\ p_{neg} \\ q_{neg} \\ s_{pos} \\ s_{neg} \end{bmatrix}_n$$

After expanding the specification of the noise covariance matrix $\Xi$ from 4×4 to 6×6 to accommodate the inclusion of two new noise variables, these being the unknown change to the degradation rate for the positive electrode and a similar unknown for the negative electrode, and expanding the definitions of the matrices F and G to encompass the state transition equations for the new state elements $p_{pos}$ and $p_{neg}$, the Kalman filter equations retain the same form as above, as will be appreciated by those skilled in the art.

Estimating Quantities that are Functions of the State

The variance of a differentiable scalar function of the state, $a(x_n)$, may be approximated as:

$$\mathrm{var}(a(x)) \approx \nabla a^T \mathrm{cov}(x) \nabla a$$

Using this principle, formulas for computing various functions of the state and approximating the uncertainty in their estimates are given below. The quantities so treated are anode capacity, cathode capacity, negative-to-positive capacity ratio, open circuit voltage, full-cell capacity, and lithium retention.

Anode and Cathode Capacities

The individual electrode capacities may be defined as the respective reciprocals of $q_{pos,n}$ and $q_{neg,n}$. However, the variances require a linearization, since taking the reciprocal is a nonlinear transformation. The variance in the estimate of $\mathrm{Cap}_{pos,n}$, the capacity of the positive electrode at time $t_n$, may be approximated as $\sigma_{cap,pos}^2 = AP_{n|n}A^T$, where:

$$A = \begin{bmatrix} -\dfrac{1}{q_{pos,n}^2} & 0 & 0 & 0 \end{bmatrix}.$$

Similarly, the variance in the estimate of $\mathrm{Cap}_{neg,n}$ may be approximated as $\sigma_{cap,neg}^2 = BP_{n|n}B^T$, where:

$$B = \begin{bmatrix} 0 & -\dfrac{1}{q_{neg,n}^2} & 0 & 0 \end{bmatrix}.$$

Updated Negative to Positive Ratio

The updated Negative to Positive Ratio (or N/P ratio, $R_{NP,n}$) may be defined as the ratio of anode capacity to cathode capacity:

$$R_{NP,n} = \frac{q_{pos,n}}{q_{neg,n}}.$$

Based on a linear approximation, the respective variance value of the Negative to Positive Ratio is:

$$\sigma_{NP,n}^2 = AP_{n|n}A^T, \text{ where: } A = \begin{bmatrix} \dfrac{1}{q_{neg,n}} & -\dfrac{q_{pos,n}}{q_{neg,n}^2} & 0 & 0 \end{bmatrix}.$$

Updated Open Circuit Voltage

The open circuit voltage of the battery cell 20, referred to herein as full cell OCV, may be obtained in terms of the cathode state of charge as:

$$OCV(s_{pos}) = U_{pos}(s_{pos}) - U_{neg}\left(-(s_{pos} - s_{pos,n})\frac{q_{neg,n}}{q_{pos,n}} + s_{neg,n}\right) =$$

$$U_{pos}(s_{pos}) - U_{neg}\left(-\frac{(s_{pos} - s_{pos,n})}{R_{NP,n}} + s_{neg,n}\right)$$

The associated uncertainty of the open circuit voltage of the battery cell 20 is SOC dependent and may be specified as: $\sigma_{OCV}^2(s_{pos}) = A(s_{pos})P_{n|n}A(s_{pos})^T$.

Here: $A(s_{pos}) = \begin{bmatrix} \dfrac{\partial OCV}{\partial q_{pos,n}} & \dfrac{\partial OCV}{\partial q_{neg,n}} & \dfrac{\partial OCV}{\partial s_{pos,n}} & \dfrac{\partial OCV}{\partial s_{neg,n}} \end{bmatrix} =$ $$\begin{bmatrix} -\dfrac{\partial U_{neg}}{\partial x}(x)\dfrac{(s_{pos} - s_{pos,n})q_{neg,n}}{q_{pos,n}^2} \\ \dfrac{\partial U_{neg}}{\partial x}(x)\dfrac{s_{pos} - s_{pos,n}}{q_{pos,n}} \\ -\dfrac{\partial U_{neg}}{\partial x}(x)\dfrac{q_{neg,n}}{q_{pos,n}} \\ -\dfrac{\partial U_{neg}}{\partial x}(x) \end{bmatrix}.T$$

The Factor $\dfrac{\partial U_{neg}}{\partial x}(x)$ is evaluated at $x = \left[\dfrac{(s_{pos} - s_{pos,n})q_{neg,n}}{q_{pos,n}} + s_{neg,n}\right]$.

Updated Full Cell Capacity

The controller C may be configured to obtain an updated full cell capacity for the battery cell 20 by solving a nonlinear system of equations fulfilling the following boundary conditions, such that when SOC=0, OCV=$V_0$, and when SOC=1, OCV=$V_1$. The state of charge for the battery cell 20 may be found using Newton's method of root finding (or other root finding method) as described below. Solving for $y_0$, the state of charge for the cathode 28 when SOC=0 is determined as:

$$V_0 = OCV(y_0) = U_{pos}(y_0) - U_{neg}\left(-\frac{(y_0 - s_{pos,n})}{R_{NP,n}} + s_{neg,n}\right)$$

This may be re-written as:

$$F_0(y_0, x_n) = U_{pos}(y_0) - U_{neg}\left(-\frac{(y_0 - s_{pos,n})}{R_{NP,n}} + s_{neg,n}\right) - V_0 = 0.$$

Here, $x_n$ is the current estimate, which is available: $\hat{x}_{n|n}=[q_{pos,n} \; q_{neg,n} \; s_{pos,n} \; s_{neg,n}]^T$. Similarly, at the top of charge, we have:

$$F_1(y_1, x_n) = U_{pos}(y_1) - U_{neg}\left(-\frac{(y_1 - s_{pos,n})}{R_{NP,n}} + s_{neg,n}\right) - V_1 = 0$$

After solving these for $y_0$ and $y_1$, respectively, the corresponding anode state of charge may be calculated as:

$$x_i = -\frac{(y_i - s_{pos,n})}{R_{NP,n}} + s_{neg,n},$$

i=0,1. After solving for $y_0$, $y_1$, $x_0$, $x_1$, the cell capacity may be calculated as follows:

$$Cap_n = \frac{|y_1 - y_0|}{q_{pos,n}} = \frac{|x_1 - x_0|}{q_{neg,n}}$$

Alternatively, instead of defining top of charge in terms of a full-cell voltage, $V_1$, it may be redefined by fixing $y_1$ to be a constant value throughout life, in which case, the same formula for $Cap_n$ holds, but $y_1$ is specified as a constant.

Cell Capacity Variance

To determine the associated uncertainty of the cell capacity, the controller C is configured to first determine the covariance of the three quantities used to compute it, namely, $y_{0,n}$, $y_{1,n}$, $q_{pos,n}$. Let $$B_i = \left(\frac{\partial OCV}{\partial y_i}\right)^{-1} A(y_i),$$

i=0,1, where A(y) is the 1×4 array of partial derivatives given above as $A(s_{pos})$ and where $$\frac{\partial OCV}{\partial y_i}(y_i) = \frac{\partial U_{pos}}{\partial y}(y_i) + \frac{\partial U_{neg}}{\partial x}(y_i)\frac{q_{neg,n}}{q_{pos,n}}.$$

Additionally, let $e_1=[1 \; 0 \; 0 \; 0]$. Then $$C = \text{cov}\left(\begin{bmatrix} y_0 \\ y_1 \\ q_{pos,n} \end{bmatrix}\right) = \begin{bmatrix} B_0 \\ B_1 \\ e_1 \end{bmatrix} P_{n|n} \begin{bmatrix} B_0 \\ B_1 \\ e_1 \end{bmatrix}^T.$$

Next, since $y_1 < y_0$, the partial derivative array for the capacity is $$D = \begin{bmatrix} \frac{\partial Cap_n}{y_0} & \frac{\partial Cap_n}{y_1} & \frac{\partial Cap_n}{q_{pos,n}} \end{bmatrix} = \begin{bmatrix} \frac{-1}{q_{pos,n}} & \frac{1}{q_{pos,n}} & \frac{-Cap_n}{q_{pos,n}} \end{bmatrix}.$$

This leads to the final result:

$$\sigma^2(Cap_n) = DCD^T = \left(D\begin{bmatrix} B_0 \\ B_1 \\ e_1 \end{bmatrix}\right) P_{n|n} \left(D\begin{bmatrix} B_0 \\ B_1 \\ e_1 \end{bmatrix}\right)^T.$$

In the case of the above, there is no uncertainty in $y_1$ because it is pre-specified. This simplifies the formulas above: delete $B_1$ from the formula for C and delete the middle element of D before evaluating $\sigma^2(Cap_n)DCD^T$.

Updated Lithium Retention

The controller C may be configured to determine an updated remaining active lithium factor ($Li_{Ret,n}$) as follows:

$$Li_{Ret,n} = \left[\frac{s_{pos,n}}{q_{pos,n}} + \frac{s_{neg,n}}{q_{neg,n}}\right].$$

The associated uncertainty may be calculated using a linear approximation as follows: $\sigma_{Li,n}^2 = AP_{n|n}A^T$, where:

$$A = \left[-\frac{s_{pos,n}}{q_{pos,n}^2} \; -\frac{s_{neg,n}}{q_{neg,n}^2} \; \frac{1}{q_{pos,n}} \; \frac{1}{q_{neg,n}}\right].$$

In summary, the controller C may be configured to determine estimated individual electrode capacities and states of charge, and their uncertainties to quantify uncertainty in full cell capacity, cell open circuit voltage, N to P ratio, and loss of active lithium. The controller C may be configured to accurately reconstruct the open circuit voltage of an aging battery, improving regression of other parameters such as state of charge. The method 100 enables covariance estimates of estimated and derived quantities, which assists in decision making for battery control, management, and maintenance. Accordingly, execution of the method 100 (via controller C) improves the functioning of the device 14.

The controller C includes a computer-readable medium (also referred to as a processor-readable medium), including a non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, other magnetic media, a CD-ROM, DVD, other optical and physical media with patterns of holes, a RAM, a PROM, an EPROM, a FLASH-EEPROM, other memory chips or cartridges, or other media from which a computer may read.

Look-up tables, databases, data repositories or other data stores described herein may include various kinds of mechanisms for storing, accessing, and retrieving various kinds of data, including a hierarchical database, a set of files in a file rechargeable energy storage system, an application database in a proprietary format, a relational database energy management system (RDBMS), etc. Each such data store may be included within a computing device employing a computer operating system such as one of those mentioned above and may be accessed via a network in one or more of a variety of manners. A file system may be accessible from a computer operating rechargeable energy storage system and may include files stored in various formats. An RDBMS may employ the Structured Query Language (SQL) in addition to a language for creating, storing, editing, and executing stored procedures, such as the PL/SQL language mentioned above.

The flowchart in FIG. 2 illustrate an architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by specific purpose hardware-based rechargeable energy storage systems that perform the specified functions or acts, or combinations of specific purpose hardware and computer instructions. These computer program instructions may also be stored in a computer-readable medium that can direct a controller or other programmable data processing apparatus to function in a particular manner, such that the instructions stored in the computer-readable medium produce an article of manufacture including instructions to implement the function/act specified in the flowchart and/or block diagram blocks.

The terms "calibration", "calibrated", and related terms refer to a result or a process that compares an actual or standard measurement associated with a device or system with a perceived or observed measurement or a commanded position for the device or system. A calibration as described herein can be reduced to a storable parametric table, a plurality of executable equations or another suitable form that may be employed as part of a measurement or control routine. A parameter is defined as a measurable quantity that represents a physical property of a device or other element that is discernible using one or more sensors and/or a physical model. A parameter may have a discrete value, e.g., either "1" or "0", or may be infinitely variable in value.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A method for tracking a battery cell in a device having one or more sensors and a controller with a processor and tangible, non-transitory memory, the battery cell having an anode and a cathode, the method comprising:
   obtaining respective sensor data relative to the anode and the cathode, via the one or more sensors;
   determining a predicted anode capacity and a predicted cathode capacity based on the respective sensor data, via the controller, the predicted anode capacity and the predicted cathode capacity each having a respective variance value;
   selectively executing a Kalman filter module defining respective state variables, including a scaled reciprocal of the predicted cathode capacity, the scaled reciprocal of the predicted anode capacity, a cathode degradation rate coefficient and an anode degradation rate coefficient, via the controller;
   generating an updated set of variables and updated respective variance values based in part on the predicted anode capacity, the predicted cathode capacity and a measured equilibrium voltage, via the Kalman filter module, the updated set of variables including an updated anode capacity and an updated cathode capacity; and
   controlling operation of the battery cell based in part on the updated set of variables and the updated respective variance values, via the controller.

2. The method of claim 1, further comprising:
   determining an integrated current value based on Coulomb counting and the respective sensor data, via the controller;
   determining the predicted anode state of charge and the predicted cathode state of charge based at least partially on the predicted anode capacity, the predicted cathode capacity and the integrated current value, via the controller, the respective state variables including the predicted anode state of charge and the predicted cathode state of charge; and
   including in the updated set of variables an updated anode state of charge and an updated cathode state of charge.

3. The method of claim 1, wherein:
   the controller is configured to obtain the measured equilibrium voltage based on at least one of a battery state estimator module and the respective sensor data; and
   controlling operation of the battery cell includes transmitting a message when at least one of the updated set of variables is outside a predefined range.

4. The method of claim 1, wherein controlling operation of the battery cell includes:
   resting the battery cell for a predefined time when at least one of the updated set of variables is outside a predefined range.

5. The method of claim 1, wherein controlling operation of the battery cell includes:
   charging or discharging the battery cell when at least one of the updated set of variables is outside a predefined range and determining an updated charge capacity.

6. The method of claim 1, further comprising:
   determining an updated full cell capacity for the battery cell and an associated uncertainty, via the controller, based in part on the updated set of variables and the updated respective variance values.

7. The method of claim 1, further comprising:
   determining an updated open circuit voltage for the battery cell and an associated uncertainty, via the controller, based in part on the updated set of variables and the updated respective variance values.

8. The method of claim 1, further comprising:
   determining an updated anode capacity degradation rate and an updated cathode capacity degradation rate and respective associated uncertainties, via the controller, based in part on the updated set of variables and the updated respective variance values.

9. The method of claim 1, further comprising:
determining an updated negative to positive ratio of electrochemical capacity and an associated uncertainty, via the controller, based in part on the updated set of variables and the updated respective variance values.

10. The method of claim 1, further comprising:
determining an updated remaining active lithium factor and an associated uncertainty, via the controller, based in part on the updated set of variables and the updated respective variance values.

11. A device comprising:
a battery cell with an anode and a cathode;
one or more sensors configured to obtain respective sensor data relative to the anode and the cathode;
a controller in communication with the one or more sensors, the controller being configured to selectively execute a Kalman filter module defining respective state variables, including a scaled reciprocal of the predicted cathode capacity, the scaled reciprocal of the predicted anode capacity, a cathode degradation rate coefficient and an anode degradation rate coefficient;
wherein the controller includes a processor and tangible, non-transitory memory on which instructions are recorded, execution of the instructions by the processor causing the controller to:
obtain respective sensor data relative to the anode and the cathode, via the one or more sensors;
determine a predicted anode capacity and a predicted cathode capacity based on the respective sensor data, via the controller, the predicted anode capacity and the predicted cathode capacity each having a respective variance value;
generate an updated set of variables and updated respective variance values based in part on the predicted anode capacity, the predicted cathode capacity and a measured equilibrium voltage, via the Kalman filter module, the updated set of variables including an updated anode capacity and an updated cathode capacity; and
control operation of the battery cell based in part on the updated set of variables and the updated respective variance values, via the controller.

12. The device of claim 11, wherein the battery cell is part of a battery pack, and wherein:
controlling operation of the battery cell includes derating a power rating of the battery pack.

13. The device of claim 11, wherein:
the controller is configured to obtain the measured equilibrium voltage based on at least one of a battery state estimator module and the respective sensor data; and
controlling operation of the battery cell includes transmitting a message when at least one of the updated set of variables is outside a predefined range.

14. The device of claim 11, wherein controlling operation of the battery cell includes:
resting the battery cell for a predefined time when at least one of the updated set of variables is outside a predefined range.

15. The device of claim 11, wherein controlling operation of the battery cell includes:
charging or discharging the battery cell when at least one of the updated set of variables is outside a predefined range and determining an updated charge capacity.

16. The device of claim 11, wherein the controller is configured to:
determine an updated full cell capacity for the battery cell and an associated uncertainty, via the controller, based in part on the updated set of variables and the updated respective variance values; and
determine an updated open circuit voltage for the battery cell and an associated uncertainty, via the controller, based in part on the updated set of variables and the updated respective variance values.

17. The device of claim 11, wherein the controller is configured to:
determine an integrated current value based on Coulomb counting and the respective sensor data, via the controller;
determine a predicted anode state of charge and a predicted cathode state of charge based at least partially on the predicted anode capacity, the predicted cathode capacity and the integrated current value, via the controller, the respective state variables including the predicted anode state of charge and the predicted cathode state of charge; and
wherein the updated set of variables includes an updated anode state of charge and an updated cathode state of charge.

18. The device of claim 11, wherein the controller is configured to:
determine an updated anode capacity degradation rate and an updated cathode capacity degradation rate and respective associated uncertainties, via the controller, based in part on the updated set of variables and the updated respective variance values.

19. The device of claim 11, wherein the controller is configured to:
determine an updated negative to positive ratio of electrochemical capacity and an associated uncertainty, via the controller, based in part on the updated set of variables and the updated respective variance values; and
determine an updated remaining active lithium factor and an associated uncertainty, via the controller, based in part on the updated set of variables and the updated respective variance values.

20. The device of claim 11, wherein the one or more sensors include:
a voltage sensor configured to generate a voltage signal representative of a voltage between the anode and the cathode during an equilibrium condition;
a current sensor configured to generate a current signal representative of a current associated with the battery cell; and
a temperature sensor configured to generate respective temperature signals associated with the anode and the cathode.

* * * * *